United States Patent
Nakazawa et al.

(10) Patent No.: US 8,305,128 B2
(45) Date of Patent: Nov. 6, 2012

(54) SPURIOUS PULSE GENERATOR

(75) Inventors: Masayuki Nakazawa, Kyoto-fu (JP); Junichi Ohi, Muko (JP); Tetsuo Furumiya, Kyoto (JP); Masafumi Furuta, Kyoto (JP)

(73) Assignee: Shimadzu Corporation, Kyoto (JP)

( * ) Notice: Subject to any disclaimer, the term of this patent is extended or adjusted under 35 U.S.C. 154(b) by 14 days.

(21) Appl. No.: 12/933,730

(22) PCT Filed: Mar. 21, 2008

(86) PCT No.: PCT/JP2008/055313
§ 371 (c)(1),
(2), (4) Date: Sep. 21, 2010

(87) PCT Pub. No.: WO2009/116176
PCT Pub. Date: Sep. 24, 2009

(65) Prior Publication Data
US 2011/0018603 A1 Jan. 27, 2011

(51) Int. Cl.
*H03K 3/01* (2006.01)

(52) U.S. Cl. .......... 327/291; 327/94; 327/165; 327/299; 341/155; 341/161

(58) Field of Classification Search .................. 341/144, 341/152, 155, 161–162; 327/91, 94, 96, 327/165, 172, 174, 291, 298, 299
See application file for complete search history.

(56) References Cited

U.S. PATENT DOCUMENTS 5,821,781 A * 10/1998 Rigazio ........................... 327/99
6,407,951 B2 * 6/2002 Tomita et al. ............ 365/189.07
7,414,564 B1 * 8/2008 Ali ................................ 341/161

OTHER PUBLICATIONS

"Random Tail Pulse Generator BNC Model DB-2", FAST ComTec (Sep. 16, 2010), www.fastcomtec.com/products/product-lines/nuclear-pulse-generators/bnc-model-db-2.html.
"Tail Pulse Generator BNC Model BL-2", FAST ComTec (Sep. 16, 2010), www.fastcomtec.com/products/product-lines/nuclear-pulse-generators/bnc-model-bl-2.html.

* cited by examiner

*Primary Examiner* — An Luu
(74) *Attorney, Agent, or Firm* — Cheng Law Group, PLLC (57) ABSTRACT

According to a spurious pulse generator of this invention, integrating circuits are provided at a plurality of stages for carrying out integrating operations about time and outputting a spurious pulse, the integrating circuits being constructed to input a voltage value for controlling a crest value which is a peak swing of the spurious pulse to an amplifier forming an integrating circuit at a most upstream stage when a switching element is ON, and to input a constant voltage value when the switching element is OFF. As a result, the voltage value before ON-state and after ON-state of the switching element does not change but remains a constant voltage value, thereby obtaining a desired spurious pulse.

5 Claims, 4 Drawing Sheets

SPURIOUS PULSE GENERATOR

TECHNICAL FIELD

This invention relates to a spurious pulse generator for generating a spurious pulse.

BACKGROUND ART

A processing circuit or a processing system is evaluated by inputting a pulse outputted at random to a circuit at a subsequent stage. The pulse is in many cases outputted at random as above, and includes radiation, cosmic rays and noises (e.g. white noise, thermal noise and so on). These pulses are not actually used, but a pulse is generated spuriously, and a processing circuit or a processing system at a subsequent stage is evaluated using the pulse generated spuriously (hereinafter called "spurious pulse").

Here, the spurious pulse will be described, taking for example a radiation spurious pulse used in place of radiation used in a nuclear medicine diagnostic apparatus such as a PET (Positron Emission Tomography) apparatus. A PET apparatus is constructed to reconstruct a sectional image of a patient only when a plurality of detectors simultaneously detect a pair of γ-rays generated by annihilation of positrons.

Specifically, a radioactive drug including a positron-emitting radionuclide is injected into the body of a patient, and detectors consisting of numerous detecting element (e.g. scintillator) groups detect pair annihilation γ-rays of 511 KeV released from the patient injected. And when two detectors detect γ-rays within a definite period of time, they are counted as one pair of annihilation γ-rays detected as a coincidence, and a pair annihilation generating point is determined to exist on a straight line linking the detector pair having detected them. Such coincidence information is accumulated and reconstruction is carried out to obtain a positron-emitting radionuclide distribution image (i.e. a sectional image).

The PET apparatus obtains the above sectional image by inputting a radiation pulse obtained with the radiation detector (pulse converted into light by the scintillators) to a pulse processing circuit at a subsequent stage, and further processing the inputted radiation pulse in an arithmetic processing circuit. Usually, in order to evaluate the pulse processing circuit of the PET apparatus, the actual radiation pulse obtained with the radiation detector may be inputted to the circuit at a subsequent stage. In that case, since a radioactive source such as $^{22}$Na point radiation source is used, it is necessary to carry out the operation in a radiation controlled area. However, the pulse processing circuit can be evaluated outside the radiation controlled area, without using the radioactive source and radiation detector, by inputting a radiation spurious pulse generated by a spurious pulse generator to the pulse processing circuit at the subsequent stage. The spurious pulse generator is used also for purposes including evaluation of a processing substrate having such a circuit at a subsequent stage mounted thereon, evaluation of software for the spurious pulse generator, debugging at a time of a fault occurrence with the processing substrate or software (in order to remove the fault), an inspection apparatus for periodical checking of the PET apparatus, and verification (daily quality assurance) of the PET apparatus.

A pulse shape generator is used as the spurious pulse generator. An ordinary pulse shape generator can generate only a cyclic waveform like rectangular waves or triangular waves. The rise/fall times of a pulse are also uncontrollable. Therefore, it is difficult to generate a waveform similar to a radiation spurious pulse. The apparatus cited hereunder are commercially available as apparatus which output radiation spurious pulses (see Nonpatent Documents 1 and 2, for example). In either case, waveform is adjusted by a switch or dial encoder attached to the main frame of the apparatus.

BNC Model BL-2 FAST Tail Pulse Generator (see Nonpatent Document 1)
  Characteristics
  The following parameters are adjustable by a dial encoder attached to the apparatus:
  output cycle (1 kHz-50 MHz)
  pulse amplitude (0-3.0V)
  adjustment of rise time (adjustable to 3, 5, 10, 30, 100 and 250 ns)
  adjustment of fall time (adjustable to 5, 10, 30, 100, 300 ns and 1, 3 and 10 μs)
    Rise/fall times are discretely variable only to the preset values in the parentheses.
    Outputs from two poles are possible.
    Outputs can be made only in regular cycles.
  BNC Model DB-2 FAST Tail Pulse Generator (see Nonpatent Document 2)
  Characteristics
  In pulse output timing, there are repeated/random output modes and changeover can be made with a switch attached to the apparatus.
  Rise time is adjustable to 100 ns-20 μm (eight steps).

Figure 4:
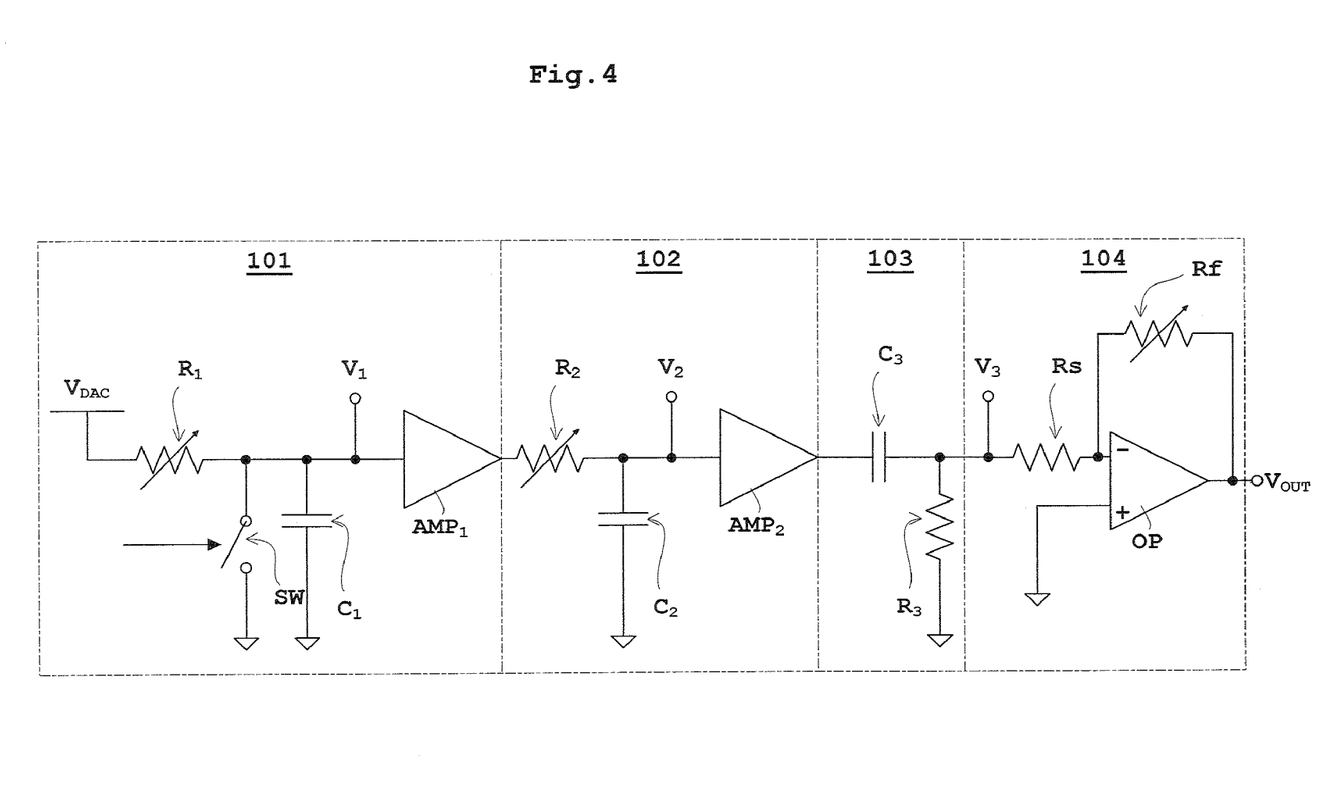
FIG. 4 is a specific circuit diagram of a conventional spurious pulse generator.

A specific circuit of a spurious pulse generator will be described with reference to FIG. 4. FIG. 4 is a specific circuit diagram of a conventional spurious pulse generator. The spurious pulse generator, as shown in FIG. 4, has integrating circuits at a plurality of stages for carrying out integrating operations about time and outputting a spurious pulse. In FIG. 4, two stages of integrating circuits 101, 102 are provided, the upstream integrating circuit being integrating circuit 101, and the downstream integrating circuit being integrating circuit 102. The upstream integrating circuit 101 includes an amplifier $AMP_1$, a variable resistor $R_1$ connected to an input side of amplifier $AMP_1$, and a capacitance $C_1$ connected to the input side of amplifier $AMP_1$ and connected to ground potential. The downstream integrating circuit 102 includes an amplifier $AMP_2$, a variable resistor $R_2$ connected to an input side of amplifier $AMP_2$, and a capacitance $C_2$ connected to the input side of amplifier $AMP_2$ and connected to ground potential. An output side of amplifier $AMP_1$ of the integrating circuit 101 and the variable resistor $R_2$ of the integrating circuit 102 are connected in series.

On the other hand, a differentiating circuit 103 and an inverting amplifier circuit 104 are provided downstream of the integrating circuit 102. The differentiating circuit 103 includes a capacitance $C_3$ connected to a resistor Rs of the inverting amplifier circuit 104 to be described hereinafter, and a resistor $R_3$ connected to the resistor Rs and connected to ground potential. An output side of amplifier $AMP_2$ of the integrating circuit 102 and the capacitance $C_3$ of the differentiating circuit 103 are connected in series. The inverting amplifier circuit 104 includes the resistor Rs, a variable resistor Rf connected to the resistor Rs, and an operational amplifier OP connected to the resistor Rs.

The integrating circuit 101 is constructed such that a voltage value $V_{DAC}$ converted from a digital value into an analog value by a DA converter (DAC: Digital to Analog Converter) is inputted to the amplifier $AMP_1$ of the integrating circuit 101 when a switching element SW is OFF. The voltage at the output side of the operational amplifier OP and the output side of the variable resistor Rf of the inverting amplifier circuit 104 is set to $V_{OUT}$. The voltage at the input side of the amplifier $AMP_1$ of the integrating circuit 101 is set to $V_1$. The voltage at the input side of the amplifier $AMP_2$ of the integrating circuit 102 is set to $V_2$. The voltage at the output side of the resistor Rs and capacitance $C_3$ of the differentiating circuit 103 and at the input side of the resistor Rs of the inverting amplifier circuit 104 is set to $V_3$.

The above voltage value $V_{DAC}$ is a voltage value for controlling a crest value which is a peak swing of the spurious pulse. In order to generate a spurious pulse having various crest values, the value of voltage value $V_{DAC}$ is changed at each ON/OFF changeover of the switching element SW. Ground potential is inputted when the switching element SW is ON.

NONPATENT DOCUMENT 1

"FAST ComTec BNC Model BL-2", [online], fast comtec, Internet <URL: http://www.fastcomtec.com/products/product-lines/nuclear-pulse-generators/bnc-model-bl-2.html>

NONPATENT DOCUMENT 2

"FAST ComTec BNC Model DB-2", [online], fast comtec, Internet <URL: http://www.fastcomtec.com/products/product-lines/nuclear-pulse-generators/bnc-model-db-2.html>

DISCLOSURE OF THE INVENTION

Problem to be Solved by the Invention

However, with the circuit shown in FIG. 4, when the switching element SW is switched OFF→ON→OFF, the input voltage to the amplifier $AMP_1$ of the integrating circuit 101 will change as $V_{DAC}$→GND (ground potential)→$V_{DAC}$. When changing the crest value for each pulse, $V_{DAC}$ must also be changed for each pulse as noted above. Then, since a variation occurring with $V_{DAC}$ as seen before ON-state and after ON-state of the switching element SW also passes through the integrating circuits, a desired spurious pulse cannot be obtained.

This invention has been made having regard to the state of the art noted above, and its object is to provide a spurious pulse generator which can obtain a desired spurious pulse.

Means for Solving the Problem

To fulfill the above object, this invention provides the following construction.

A spurious pulse generator for generating a spurious pulse, of this invention, comprises integrating circuits at a plurality of stages for carrying out integrating operations about time and outputting the spurious pulse, wherein the integrating circuits are constructed to input a voltage value for controlling a crest value which is a peak swing of the spurious pulse to an amplifier forming an integrating circuit at a most upstream stage when a switching element is ON, and to input a constant voltage value when the switching element is OFF.

According to the spurious pulse generator of this invention, of the integrating circuits at a plurality of stages for carrying out integrating operations about time and outputting a spurious pulse, the integrating circuit at the most upstream stage is constructed to input a voltage value for controlling a crest value which is a peak swing of the spurious pulse to the amplifier forming the integrating circuit when the switching element is ON, and to input a constant voltage value when the above switching element is OFF. In the conventional case, a voltage value which controls the crest value is inputted when the switching element is OFF. Since a variation occurring with the voltage value which controls the crest value, as seen before ON-state and after ON-state of the switching element, also passes through the integrating circuit, a desired spurious pulse cannot be obtained. In this invention, to the amplifier of the integrating circuit at the most upstream stage, the voltage value for controlling the crest value is inputted when the switching element is ON, and the constant voltage value is inputted when the switching element is OFF. Therefore, even if the switching element is switched as OFF→ON→OFF, the input voltage inputted to the amplifier forming the integrating circuit at the most upstream stage changes as "constant voltage value"→"voltage value for controlling the crest value"→"constant voltage". Therefore, the voltage value before ON-state and after ON-state of the switching element does not change but remains the constant voltage value, thereby obtaining a desired spurious pulse.

With the spurious pulse generator of this invention, ON/OFF timing by the switching element may be random, or the ON/OFF timing by the switching element may be cyclic. However, since the spurious pulse is in many cases used in place of a pulse outputted at random, when the ON/OFF timing of the switching element is random as in the former case, the timing of the spurious pulse generated will also become random. Therefore, when using the spurious pulse in place of the pulse outputted at random, the former is preferable.

In one example of the former, a timing distribution with a horizontal axis representing the timing and a vertical axis representing frequency is a fixed uniform distribution or a Gaussian distribution, and the timing is made random according to the fixed uniform distribution or the Gaussian distribution. Of course, the ON/OFF timing by the switching element may be made random by other technique.

Similarly to the above timing, in the spurious pulse generator of the above invention, the crest value may be random. By making the crest value random, the spurious pulse can be used in place of noise with a random crest value. Thus, the above timing may be random, and the crest value may also be random.

Similarly to the above timing, a crest value distribution with a horizontal axis representing the crest value and a vertical axis representing frequency may be a fixed uniform distribution or a Gaussian distribution, and the crest value may be made random according to the fixed uniform distribution or the Gaussian distribution. The crest value may be made random by other technique.

With the spurious pulse generator of this invention, it is preferred that a rise time or a fall time of the spurious pulse is controlled by making variable at least one of values of resistors and capacitances forming the integrating circuits. Spurious pulses with various rise times and fall times can be generated.

Effects of the Invention

With the spurious pulse generator according to this invention, integrating circuits are provided at a plurality of stages for carrying out integrating operations about time and outputting a spurious pulse, the integrating circuits being constructed to input a voltage value for controlling a crest value which is a peak swing of the spurious pulse to an amplifier forming an integrating circuit at a most upstream stage when a switching element is ON, and to input a constant voltage value when the above switching element is OFF. As a result, the voltage value before ON-state and after ON-state of the switching element does not change but remains a constant voltage value, thereby obtaining a desired spurious pulse.

DESCRIPTION OF REFERENCES

Figure 1:
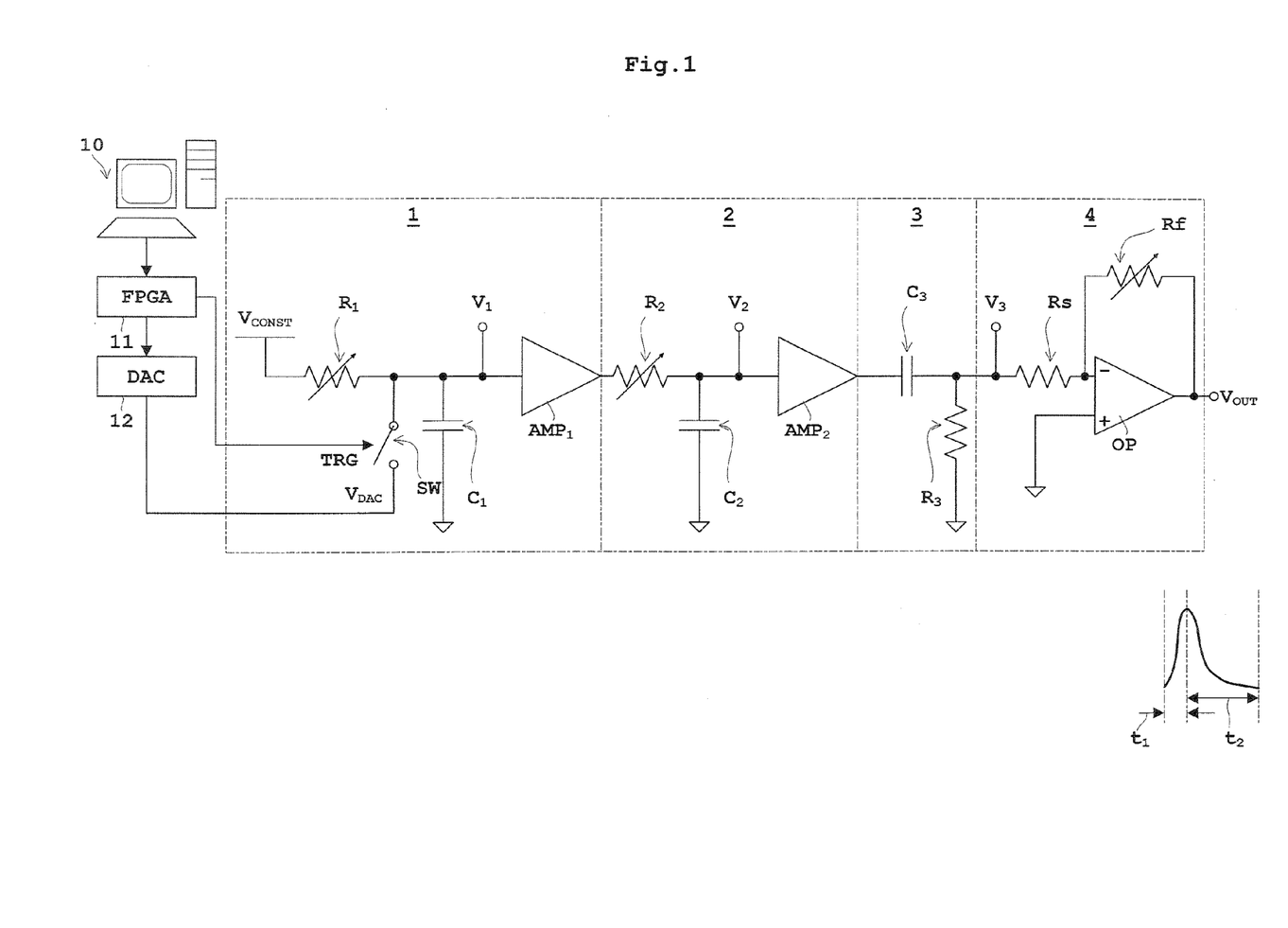
FIG. 1 is a specific circuit diagram of a spurious pulse generator according to an embodiment.
Figure 2:
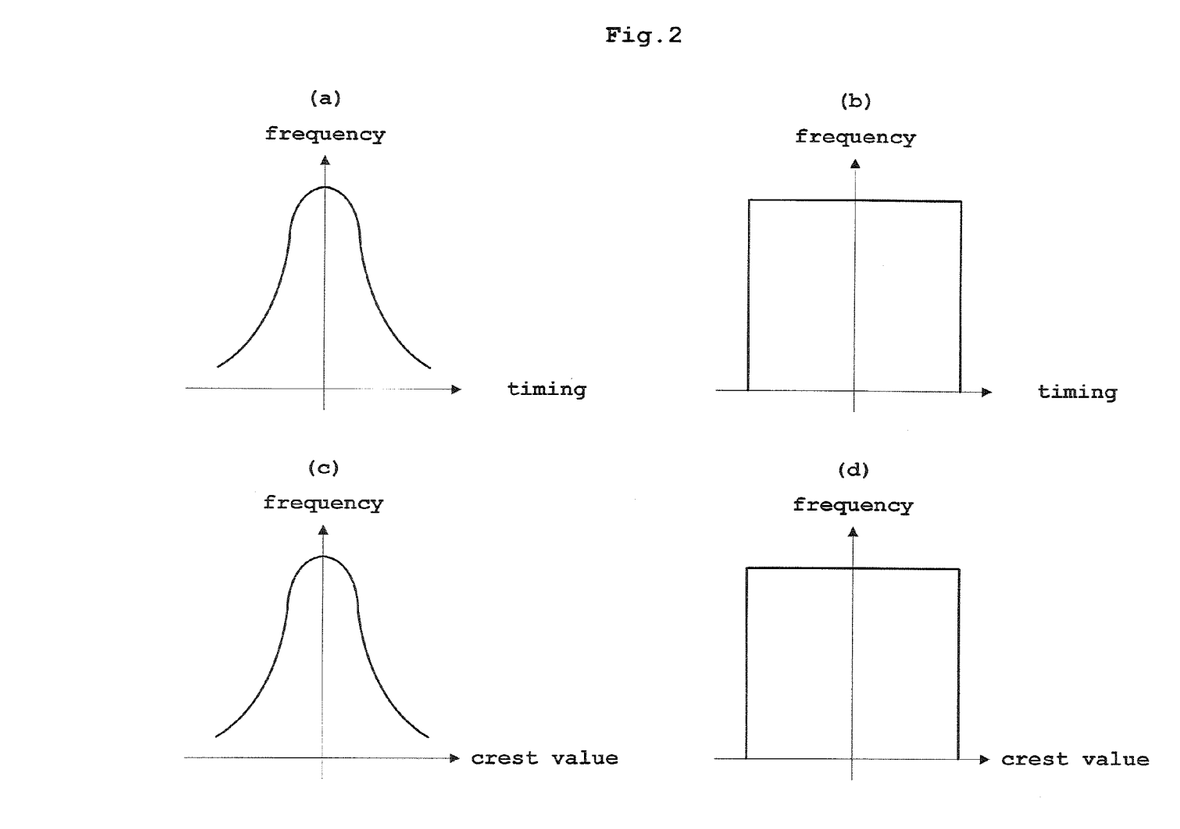
FIG. 2 provides schematic views showing (a) a timing distribution with the horizontal axis representing timing and the vertical axis representing frequency being a Gaussian distribution, (b) a timing distribution with the horizontal axis representing timing and the vertical axis representing frequency being a fixed uniform distribution, (c) a crest value distribution with the horizontal axis representing crest value and the vertical axis representing frequency being a Gaussian distribution, and (d) a crest value distribution with the horizontal axis representing crest value and the vertical axis representing frequency being a fixed uniform distribution.
Figure 3:
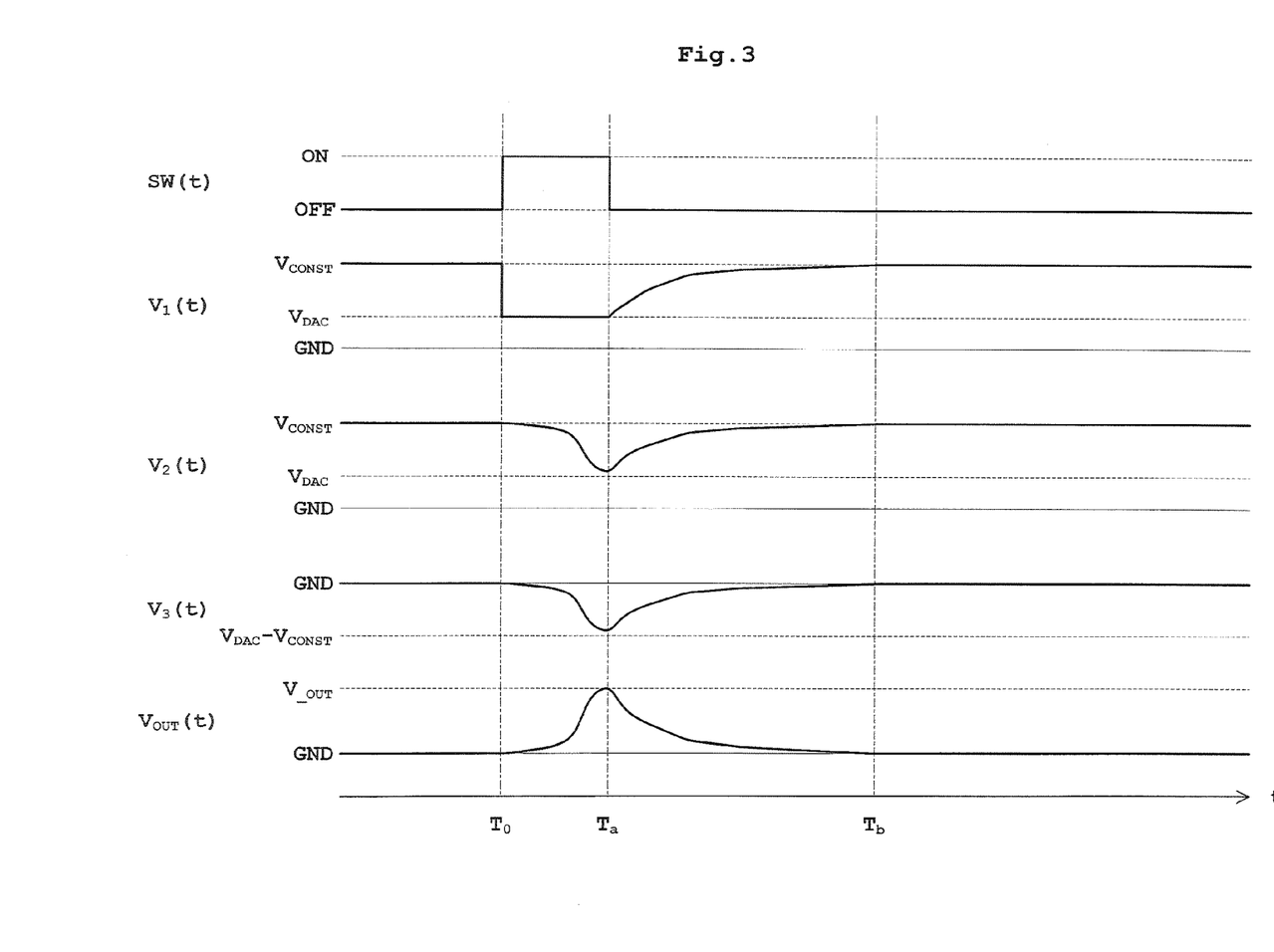
FIG. 3 is a timing chart of each voltage.

1 . . . upstream integrating circuit
2 . . . downstream integrating circuit
$R_1$ . . . variable resistor (of upstream integrating circuit)
$R_2$ . . . variable resistor (of downstream integrating circuit)
$AMP_1$ . . . amplifier (of upstream integrating circuit)
$AMP_2$ . . . amplifier (of downstream integrating circuit)
$C_1$ . . . capacitance (of upstream integrating circuit)
$C_2$ . . . capacitance (of downstream integrating circuit)
$V_{DAC}$ . . . voltage value converted from a digital value into an analog value (voltage value for controlling crest value)
$V_{CONST}$ . . . constant voltage value
SW . . . switching element Embodiment An embodiment of this invention will be described hereinafter with reference to the drawings. FIG. 1 is a specific circuit diagram of a spurious pulse generator according to the embodiment. FIG. 2 (a) is a schematic view showing a timing distribution with the horizontal axis representing timing and the vertical axis representing frequency being a Gaussian distribution. FIG. 2 (b) is a schematic view showing a timing distribution with the horizontal axis representing timing and the vertical axis representing frequency being a fixed uniform distribution. FIG. 2 (c) is a schematic view showing a crest value distribution with the horizontal axis representing crest value and the vertical axis representing frequency being a Gaussian distribution. FIG. 2 (d) is a schematic view showing a crest value distribution with the horizontal axis representing crest value and the vertical axis representing frequency being a fixed uniform distribution. FIG. 3 is a timing chart of each voltage. This embodiment will be described, taking for example a radiation spurious pulse used in place of radiation used in a nuclear medicine diagnostic apparatus such as a PET apparatus.

The spurious pulse generator, as shown in FIG. 1, has integrating circuits at a plurality of stages for carrying out integrating operations about time and outputting a spurious pulse. In FIG. 1, two stages of integrating circuits 1, 2 are provided, the upstream integrating circuit being integrating circuit 1, and downstream integrating circuit being integrating circuit 2. As in FIG. 4 showing the prior art, the upstream integrating circuit 1 includes an amplifier $AMP_1$, a variable resistor $R_1$ connected to an input side of amplifier $AMP_1$, and a capacitance $C_1$ connected to the input side of amplifier $AMP_1$ and connected to ground potential. The downstream integrating circuit 2 includes an amplifier $AMP_2$, a variable resistor $R_2$ connected to an input side of amplifier $AMP_2$, and a capacitance $C_2$ connected to the input side of amplifier $AMP_2$ and connected to ground potential. An output side of amplifier $AMP_1$ of the integrating circuit 1 and the variable resistor $R_2$ of the integrating circuit 2 are connected in series. The upstream integrating circuit 1 corresponds to the integrating circuit at the most upstream stage in this invention. The amplifier $AMP_1$ of the integrating circuit 1 corresponds to the amplifier forming the integrating circuit at the most upstream stage in this invention. The variable resistor $R_1$ of the integrating circuit 1 corresponds to the resistor forming the integrating circuit in this invention. The capacitance $C_1$ of the integrating circuit 1 corresponds to the capacitance forming the integrating circuit in this invention.

As in FIG. 4 showing the prior art, a differentiating circuit 3 and an inverting amplifier circuit 4 are provided downstream of the integrating circuit 2. The differentiating circuit 3 includes a capacitance $C_3$ connected to a resistor Rs of the inverting amplifier circuit 4 to be described hereinafter, and a resistor $R_3$ connected to the resistor Rs and connected to ground potential. An output side of amplifier $AMP_2$ of the integrating circuit 2 and the capacitance $C_3$ of the differentiating circuit 3 are connected in series. The inverting amplifier circuit 4 includes the resistor Rs, a variable resistor Rf connected to the resistor Rs, and an operational amplifier OP connected to the resistor Rs.

In FIG. 4 showing the prior art, the integrating circuit 101 is constructed such that a voltage value $V_{DAC}$ (i.e. voltage value $V_{DAC}$ for controlling a crest value which is a peak swing of the spurious pulse) converted from a digital value into an analog value by a DA converter is inputted to the amplifier $AMP_1$ of the integrating circuit 101 when a switching element SW is OFF. On the other hand, in FIG. 1 showing this embodiment, a voltage value $V_{DAC}$ converted from a digital value into an analog value by a DA converter (DAC) 12 described hereinafter is inputted to the amplifier $AMP_1$ of the integrating circuit 1 at the most upstream stage (the upstream integrating circuit 1 since this embodiment provides integrating circuits at two stages) when a switching element SW is ON. And the integrating circuit 1 is constructed to input a constant voltage value $V_{CONST}$ when the switching element SW is OFF.

As in FIG. 4 showing the prior art, the voltage at the output side of the operational amplifier OP and the output side of the variable resistor Rf of the inverting amplifier circuit 4 is set to $V_{OUT}$. The voltage at the input side of the amplifier $AMP_1$ of the integrating circuit 1 is set to $V_1$. The voltage at the input side of the amplifier $AMP_2$ of the integrating circuit 2 is set to $V_2$. The voltage at the output side of the resistor Rs and capacitance $C_3$ of the differentiating circuit 3 and at the input side of the resistor Rs of the inverting amplifier circuit 4 is set to $V_3$.

In this embodiment, the spurious pulse generator includes, in addition to the above, a programmable device having hardware circuitry (e.g. logic circuits) used inside which is changeable according to program data. In this embodiment, an FPGA (Field Programmable Gate Array) will be described as an example of the programmable device. Specifically, as shown in FIG. 1, the spurious pulse generator has a personal computer (PC) 10, an FPGA 11 and a DA converter 12 (written "DAC" in FIG. 1). The personal computer 10 is formed of a central processing unit (CPU), storage media represented by a ROM (Read-only Memory), a RAM (Random-Access Memory) and so on, and a pointing device represented by a mouse, keyboard, joystick, trackball and/or touch panel.

Setting data called "configuration data" for setting operations of the FPGA 11 is transmitted from the personal computer 10 to the FPGA 11, and the FPGA 11 carries out the operations based on the configuration data transmitted. In this embodiment, the configuration data includes data incorporating programs for generating at random trigger signals (written "TRG" in FIG. 1) which control ON/OFF of the switching element SW, and changing the voltage value $V_{DAC}$ at random through the DA converter 12. As noted above, the voltage value $V_{DAC}$ is a voltage value for controlling the crest value. The crest value is changeable by changing the value of voltage value $V_{DAC}$.

Specifically, the FPGA 11 has nonvolatile memory (e.g. flash memory) storing a random number table. Random numbers stored on the random number table are outputted from the FPGA 11 to the switching element SW, and outputted also to the DA converter 12.

On the other hand, as shown in FIG. 2 (a) and FIG. 2 (b), when timing distributions with the horizontal axis representing ON/OFF timing by the switching element SW and the vertical axis representing frequency are introduced, each timing is determined according to frequency using a random number fed from the FPGA 11. FIG. 2 (a) shows the timing distribution being a Gaussian distribution. FIG. 2 (b) shows the timing distribution being a fixed uniform distribution. Thus, according to the fixed uniform distribution or the Gaussian distribution, the timing is made random. Based on the configuration data, the trigger signals noted above are generated at random according to the timing determined in this way, and the trigger signals are given to the switching element SW. A time interval between two trigger signals consecutive in time corresponds to timing. These trigger signals switch ON/OFF of the switching element SW also at random, and the timing of the spurious pulse generated with ON/OFF of the switching element SW also becomes random.

Similarly to the timing, as shown in FIG. 2 (c) and FIG. 2 (d), when crest value distributions with the horizontal axis representing crest value and the vertical axis representing frequency are introduced, each crest value is determined according to frequency using a random number fed from the FPGA 11. FIG. 2 (c) shows the crest value distribution being a Gaussian distribution. FIG. 2 (d) shows the crest value distribution being a fixed uniform distribution. Thus, according to the fixed uniform distribution or the Gaussian distribution, the crest value is made random. To output actually the crest value determined in this way, as will be clear from the technique, described hereinafter, of controlling the crest value based on the voltage value $V_{DAC}$, the crest value will also be determined when the voltage value $V_{DAC}$ is determined. Conversely, if the crest value is determined, the voltage value $V_{DAC}$ can be determined. Based on the voltage value $V_{DAC}$, the crest value can be controlled. Then, based on the configuration data, the voltage value $V_{DAC}$ is changed at random according to the crest value, and the voltage value $V_{DAC}$ is given to the amplifier $AMP_1$ of the integrating circuit 1 when the switching element SW is ON. The voltage value $V_{DAC}$ is an analog value, and the data outputted from the FPGA 11 is a digital value. Therefore, the DA converter 12 converts the digital value into the analog value. The technique of controlling the crest value based on the voltage value $V_{DAC}$ will be described hereinafter.

A timing chart of each voltage is as shown in FIG. 3. Here, SW(t) is a temporal response of the ON/OFF of the switching element SW, $V_1(t)$ is a temporal response of voltage $V_1$ noted hereinbefore, $V_2(t)$ is a temporal response of voltage $V_2$ noted hereinbefore, $V_3(t)$ is a temporal response of voltage $V_3$ noted hereinbefore, and $V_{OUT}(t)$ is a temporal response of voltage $V_{OUT}$ noted hereinbefore. GND in FIG. 3 is ground potential.

When a trigger signal (see the "TRG" in FIG. 1) noted hereinbefore is given to the switching element SW, the switching element SW will change from OFF (written "OFF" in FIG. 3) to ON (written "ON" in FIG. 3) to give the voltage value $V_{DAC}$ to the amplifier $AMP_1$ of the integrating circuit 1. The time when the switching element SW changes from OFF to ON is set to $T_0$, and the time when it changes from ON to OFF is set to $T_a$. Regarding $V_1(t)$, for example, the switching element SW is OFF before t becomes $T_0$ ($t<T_0$), and the constant voltage value $V_{CONST}$ is given to the amplifier $AMP_1$ of the integrating circuit 1. Thus, $V_1(t)=V_{CONST}$. On the other hand, when t becomes $T_0$ and until it becomes $T_a$ ($T_0 \leq t \leq T_a$), the switching element SW is ON, and the voltage value $V_{DAC}$) is given to the amplifier $AMP_1$ of the integrating circuit 1 through the switching element SW. Thus, $V_1(t)=V_{DAC}$. When t reaches $T_a$ ($T_a<t$), the switching element SW changes to OFF whereby $V_1(t)$ changes from the voltage value $V_{DAC}$ to $V_{CONST}$. However, according to time constants of the variable resistor $R_1$ and capacitance $C_1$ of the integrating circuit 1, $V_1(t)$ changes gradually in time from the voltage value $V_{DAC}$ to $V_{CONST}$. And it substantially settles to $V_{CONST}$ at $T_b$. When this $V_1(t)$ is expressed in an equation, it is expressed as in the following equation (1). When $V_2(t)$, $V_3(t)$ and $V_{OUT}(t)$ are expressed in equations, they are expressed as in the following equations (2)-(4). Note, however, that there is no offset of each amplifier.

$$V_1(t) = V_{CONST} \ (t < T_0) \qquad (1)$$
$$= V_{DAC} \ (T_0 \leq t \leq T_a)$$
$$= V_{DAC} + (V_{CONST} - V_{DAC})[1 - \exp\{-t/(R_1 \cdot C_1)\}] \ (T_a < t)$$

$$V_2(t) = V_{CONST} \ (t < T_0) \qquad (2)$$
$$= V_{CONST} + (V_{DAC} - V_{CONST})[1 - \exp\{-t/(R_2 \cdot C_2)\}] \ (T_0 \leq t \leq T_a)$$
$$= V_1(t) + (V_{CONST} - V_1(t))[1 - \exp\{-t/(R_2 \cdot C_2)\}] \ (T_a < t)$$

$$V_3(t) \approx V_2 \qquad (3)$$

$$V_{OUT}(t) = -V_3(t) \cdot Rf / Rs \qquad (4)$$

Assuming here that the resistor $R_3$ forming the differentiating circuit 3 is 1(kΩ) and the capacitance $C_3$ is 1 (µF), the time constant of $R_a$ and $C_3$ is $1.0 \times 10^{-3}$, which provides a transit area for the pulse generated this time (rise time: several 10 ns, fall time: about 100 ns).

The rise time is set to $t_1$, and the fall time to $t_2$. Although $t_1$ and $t_2$ can be derived theoretically by solving the above equations (1)-(4), an error will actually occur under the influence of delay, parasitic resistance, parasitic capacitance and so on of the amplifier. Where, for example, $t_1=20$ ns and $t_2=100$ ns, actual element parameters are as follows:

$R_1=930$ (Ω), $R_2=426$ (Ω), $C_1=2$ (pF), $C_2=62$ (pF)

For controlling the rise time and fall time, the variable resistors $R_1$, $R_2$ and variable capacitances $C_1$, $C_2$ are changed to desired values. When the actual influence of delay, parasitic resistance, parasitic capacitance and so on of the amplifier is not taken into consideration, the values of the variable resistors $R_1$, $R_2$ and variable capacitances $C_1$, $C_2$ providing $t_1$ and $t_2$ are changed by solving the above equations (1)-(4). And the rise time and fall time are controlled by changing the values of variable resistors $R_1$, $R_2$ and variable capacitances $C_1$, $C_2$. When the actual influence of delay, parasitic resistance, parasitic capacitance and so on of the amplifier is taken into consideration, $t_1$ and $t_2$ provided when the values of variable resistor $R_1$, $R_2$ and variable capacitances $C_1$, $C_2$, respectively, may be calculated beforehand, and correspondence relations between the values of variable resistors $R_1$, $R_2$ and variable capacitances $C_1$, $C_2$, and $t_1$ and $t_2$ may be stored as a look-up table. What is necessary is just to refer to the look-up table when changing the actual variable resistors $R_1$, $R_2$ and variable capacitances $C_1$, $C_2$. And the rise time and fall time are controlled by changing the values of variable resistors $R_1$, $R_2$ and variable capacitances $C_1$, $C_2$.

$V_{OUT}(t)$ derived from equation (4) above serves as a spurious pulse generated. Equation (4) above is derived from equations (1)-(3) above, and the spurious pulse is controlled by the constant voltage value $V_{CONST}$, the voltage value $V_{DAC}$ converted from the digital value into the analog value by the DA converter 12 (i.e. the voltage value $V_{DAC}$ which controls the crest value), and the value of each of time constants $R_1$ and $C_1$ of the integrating circuit 1 and time constants $R_2$ and $C_2$ of the integrating circuit 2. Since $V_{CONST}$ is a constant voltage value, the values of the variable resistors $R_1$, $R_2$ and variable capacitances $C_1$, $C_2$ are changed as noted above when controlling the rise time and fall time, and the value of voltage value $V_{DAC}$ is changed when controlling the crest value which is the peak swing of the spurious pulse. Therefore, the crest value is controllable based on the voltage value $V_{DAC}$.

With the spurious pulse generator having above construction according to this embodiment, of the integrating circuits at a plurality of stages (integrating circuits 1 and 2 at two stages in this embodiment) for carrying out integrating operations about time and outputting a spurious pulse, the integrating circuit 1 is constructed to input a voltage value (voltage value $V_{DAC}$ converted from a digital value into an analog value in this embodiment) for controlling a crest value to the amplifier ($AMP_1$ in this embodiment) forming the integrating circuit at the most upstream stage (the upstream integrating circuit 1 in this embodiment) when the switching element SW is ON, and to input a constant voltage value (constant voltage $V_{CONST}$ in this embodiment) when the switching element SW is OFF. In the conventional case, a voltage value (see voltage value $V_{DAC}$ in FIG. 4) which controls the crest value is inputted when the switching element SW is OFF. Since a variation occurring with the voltage value (voltage value $V_{DAC}$) which controls the crest value, as seen before ON-state and after ON-state of the switching element SW, also passes through the integrating circuit, a desired spurious pulse cannot be obtained. In this embodiment, to the amplifier (amplifier $AMP_1$) of the integrating circuit at the most upstream stage (the upstream integrating circuit 1), the voltage value (voltage value $V_{DAC}$) for controlling the crest value is inputted, and the constant voltage value (constant voltage $V_{CONST}$) is inputted when the switching element SW is OFF. Therefore, even if the switching element SW is switched as OFF→ON→OFF, the input voltage inputted to the amplifier (amplifier $AMP_1$) forming the integrating circuit at the most upstream stage (the upstream integrating circuit 1) changes as "constant voltage value $V_{CONST}$"→"voltage value $V_{DAC}$ for controlling the crest value"→"constant voltage $V_{CONST}$". Therefore, the voltage value before ON-state and after ON-state of the switching element SW does not change but remains the constant voltage value (voltage value $V_{CONST}$), thereby obtaining a desired spurious pulse.

In this embodiment, the ON/OFF timing of the switching element SW is random. The spurious pulse is used in place of radiation used in a nuclear medicine diagnostic apparatus such as a PET apparatus as in this embodiment. Since such radiation is released by medicating the patient with a radioactive drug, a radiation pulse obtained with a DOI detector (pulse converted into light by scintillators) is outputted at random. Thus, since the spurious pulse is in many cases used in place of the pulse outputted at random, when the ON/OFF timing of the switching element SW is random, the timing of the spurious pulse generated will also become random. Therefore, when using the spurious pulse in place of the pulse outputted at random, it is preferable that the timing is random as in this embodiment.

In this embodiment, the timing distribution with the horizontal axis representing timing and the vertical axis frequency is a fixed uniform distribution or a Gaussian distribution. The timing is made random according to the fixed uniform distribution or the Gaussian distribution.

Similarly to the above timing, the crest value which is a peak swing of the spurious pulse in this embodiment is random. By making the crest value random, the spurious pulse can be used in place of noise with a random crest value. Thus, in this embodiment, the above timing is random, and the crest value is also random.

Similarly to the above timing, in this embodiment, the crest value distribution with the horizontal axis representing crest value and the vertical axis frequency is a fixed uniform distribution or a Gaussian distribution. The crest value is made random according to the fixed uniform distribution or the Gaussian distribution.

In this embodiment, at least one of the values of the resistor and capacitance forming an integrating circuit is made variable. Especially, as shown in FIG. 1, the resistor $R_1$, $R_2$ and capacitances $C_1$, $C_2$ forming the integrating circuits 1 and 2 are all made variable. The rise time/fall times of the spurious pulse are controlled by using the variable resistors $R_1$, $R_2$ and variable capacitances $C_1$, $C_2$ as above. Spurious pulses with various rise times and fall times can be generated.

In addition, in this embodiment, as shown in FIG. 1, configuration data are transmitted from the personal computer 10 to the FPGA 11, and thus control can be carried out from the screen of the personal computer 10. This provides also an effect of allowing the user to use the personal computer 10 with ease. The spurious pulse generator may be provided with a selecting function for selecting the fixed uniform distribution or the Gaussian distribution. The spurious pulse generator may be provided also with a selecting function for selecting random or cyclic.

An arrangement can be made to enable a plurality of pulse shapes to be outputted at a time. This can be realized by arranging the plurality of integrating circuits 1 and 2, differentiating circuit 3 and inverting amplifier 4 in parallel. When controlling the spurious pulse from each of the parameters (time constants $R_1$, $R_2$, $C_1$, $C_2$, voltage value $V_{DAC}$ and so on), it is preferable to perform this automatically in response to parameters inputted to the screen of the personal computer 10 by the user, regarding calculations based on the parameters.

Whether random or cyclic, it is possible to output a high-speed pulse with a rise time of about 20 ns. The rise time/fall time can be fine-adjusted with a trimmer represented by a variable resistor, variable capacitance or the like. The parameters (time constants $R_1$, $R_2$, $C_1$, $C_2$) for controlling the rise time/fall time may be set automatically based on switching by the switching element SW.

This invention is not limited to the foregoing embodiment, but may be modified as follows:

(1) The foregoing embodiment has been described taking, for example, a radiation spurious pulse used in place of radiation used in a nuclear medicine diagnostic apparatus such as a PET apparatus, but this is not limitative. Application may be made to a spurious pulse used in place of cosmic rays or noise (such white noise or thermal noise). This invention is useful particularly where the spurious pulse is used in place of a pulse outputted at random.

(2) The foregoing embodiment has been described taking the case of outputting at random for example, but may be applied to random outputted cyclically. Particularly, the spurious pulse can be cyclically outputted by making the ON/OFF timing by the switching element cyclic. Therefore, the ON/OFF timing by the switching element may be cyclic.

(3) In the foregoing embodiment, the ON/OFF timing by the switching element is random, and the crest value is also random. However, it is not absolutely necessary to make both random. The ON/OFF timing by the switching element may be made cyclic as noted above, and only the crest value may be made random. The ON/OFF timing by the switching element may be made random, and the crest value may be controlled to a predetermined value. The ON/OFF timing by the switching element may be made cyclic, and the crest value may be controlled to a predetermined value.

(4) In the foregoing embodiment, the timing distribution is a fixed uniform distribution or a Gaussian distribution, and the timing is made random according to the fixed uniform distribution or the Gaussian distribution. The ON/OFF timing by the switching element may be made random by other technique. Similarly, in the foregoing embodiment, the crest value distribution is a fixed uniform distribution or a Gaussian distribution, and the crest value is made random according to the fixed uniform distribution or the Gaussian distribution. The crest value may be made random by other technique.

(5) In the foregoing embodiment, the values of the resistors and capacitances forming the integrating circuits are all made variable. However, there is no limitation as to the parameters to be made variable, as long as the rise time or fall time of the spurious pulse is controlled by making at least either the resistors or the capacitances variable. Therefore, the capacitances may be fixed, and only the resistors made variable. Conversely, the resistors may be fixed, and only the capacitances made variable.

(6) In the foregoing embodiment, the resistors and capacitances forming the integrating circuits are made variable by using the variable resistors and variable capacitances, but this is not limitative. A plurality of resistors or a plurality of capacitances having different values may be connected in parallel, and switching may be made by selecting one resistor and one capacitance from the plurality of resistors or the plurality of capacitances connected in parallel, according to a spurious pulse to be generated.

(7) In the foregoing embodiment, the voltage value $V_{DAC}$ converted from a digital value into an analog value is used as the voltage value for controlling the crest value, but this is not limitative. A voltage which generates a voltage value for controlling the crest value may be directly connected to the switching element.

The invention claimed is:

1. A spurious pulse generator for generating a spurious pulse, comprising integrating circuits at a plurality of stages for carrying out integrating operations about time and outputting the spurious pulse,
    wherein the integrating circuits are constructed to input a voltage value for controlling a crest value which is a peak swing of the spurious pulse to an amplifier forming an integrating circuit at a most upstream stage when a switching element is ON, and to input a constant voltage value when the switching element is OFF,
    wherein ON/OFF timing by the switching element is random, and
    wherein a timing distribution with a horizontal axis representing the timing and a vertical axis representing frequency is a fixed uniform distribution or a Gaussian distribution, and the timing is made random according to the fixed uniform distribution or the Gaussian distribution.

2. The spurious pulse generator according to claim 1, wherein ON/OFF timing by the switching element is cyclic.

3. The spurious pulse generator according to claim 1, wherein the crest value is random.

4. A spurious pulse generator for generating a spurious pulse, comprising integrating circuits at a plurality of stages for carrying out integrating operations about time and outputting the spurious pulse,
    wherein the integrating circuits are constructed to input a voltage value for controlling a crest value which is a peak swing of the spurious pulse to an amplifier forming an integrating circuit at a most upstream stage when a switching element is ON, and to input a constant voltage value when the switching element is OFF,
    wherein the crest value is random, and
    wherein a crest value distribution with a horizontal axis representing the crest value and a vertical axis representing frequency is a fixed uniform distribution or a Gaussian distribution, and the crest value is made random according to the fixed uniform distribution or the Gaussian distribution.

5. A spurious pulse generator for generating a spurious pulse, comprising integrating circuits at a plurality of stages for carrying out integrating operations about time and outputting the spurious pulse,
    wherein the integrating circuits are constructed to input a voltage value for controlling a crest value which is a peak swing of the spurious pulse to an amplifier forming an integrating circuit at a most upstream stage when a switching element is ON, and to input a constant voltage value when the switching element is OFF,
    wherein a rise time or a fall time of the spurious pulse is controlled by making variable at least one of values of resistors and capacitances forming the integrating circuits.

* * * * *